United States Patent
Yamazaki

(10) Patent No.: US 6,828,727 B2
(45) Date of Patent: Dec. 7, 2004

(54) LIGHT EMITTING DEVICE COMPRISING A PARTITION LAYER HAVING AN OVERHANG SHAPE

(75) Inventor: Shunpei Yamazaki, Tokyo (JP)

(73) Assignee: Semiconductor Energy Laboratory Co., Ltd., Kanagawa-Ken (JP)

(*) Notice: Subject to any disclaimer, the term of this patent is extended or adjusted under 35 U.S.C. 154(b) by 188 days.

(21) Appl. No.: 09/986,425

(22) Filed: Nov. 8, 2001

(65) Prior Publication Data

US 2002/0056842 A1 May 16, 2002

(30) Foreign Application Priority Data

Nov. 10, 2000 (JP) ........................................ 2000-342739

(51) Int. Cl.[7] ........................ H05B 33/00; H05B 33/14; H05B 33/04
(52) U.S. Cl. ........................ 313/509; 313/504; 313/506; 313/512; 257/88; 257/93; 257/100
(58) Field of Search ............................ 257/88, 93, 100; 313/504, 506, 500, 509; 315/169.4

(56) References Cited

U.S. PATENT DOCUMENTS

| | | | |
|---|---|---|---|
| 5,684,365 A | | 11/1997 | Tang et al. |
| 5,701,055 A | | 12/1997 | Nagayama et al. |
| 5,952,037 A | | 9/1999 | Nagayama et al. |
| 5,952,708 A | | 9/1999 | Yamazaki |
| 6,016,033 A | * | 1/2000 | Jones et al. .................. 313/506 |
| 6,037,712 A | * | 3/2000 | Codama et al. .............. 313/504 |
| 6,057,647 A | * | 5/2000 | Kurosawa et al. ........... 313/506 |
| 6,069,443 A | * | 5/2000 | Jones et al. .................. 313/504 |
| 6,115,090 A | | 9/2000 | Yamazaki |
| 6,169,293 B1 | | 1/2001 | Yamazaki |
| 6,239,470 B1 | | 5/2001 | Yamazaki |
| 2002/0000551 A1 | * | 1/2002 | Yamazaki et al. ............ 257/59 |

FOREIGN PATENT DOCUMENTS

| | | |
|---|---|---|
| EP | 0 732 868 A1 | 9/1996 |
| JP | 8-315981 | 11/1996 |
| JP | 10-321372 | 12/1998 |
| JP | 2000-331784 | 11/2000 |

OTHER PUBLICATIONS

U.S. patent application Ser. No. 09/748,166, Yamazaki, filed Dec. 27, 2000, pending.

U.S. patent application Ser. No. 09/929,264, Yamazaki et al., filed Aug. 15, 2001, pending.

U.S. patent application Ser. No. 09/982,100, Yamazaki et al., filed Oct. 19, 2001, pending.

T. Tsutsui et al.; "Electroluminescence In Organic Thin Films"; *Photochemical Processes in Organized Molecular Systems*; pp. 437–450; 1991.

M.A. Baldo et al.; "Highly Efficient Phosphorescent Emission from Organic Electroluminescent Devices"; *Nature*, vol. 395; pp. 151–154; Sep. 10, 1998.

M.A. Baldo et al.: "Very High–Efficiency Green Organic Light–Emitting Devices Based on Electrophosphorescence"; *Applied Physics Letters*, vol. 75, No. 1; pp. 4–6; Jul. 5, 1999.

T. Tsutsui et al.; "High Quantum Efficiency in Organic Light–Emitting Devices with Iridium–Complex as a Triplet Emissive Center"; *Japan Journal of Applied Physics*, vol. 38, Part 38B, pp. L1502–L1504; Dec. 15, 1999.

* cited by examiner

*Primary Examiner*—Ashok Patel
*Assistant Examiner*—Mariceli Santiago
(74) *Attorney, Agent, or Firm*—Fish & Richardson P.C.

(57) ABSTRACT

In an active matrix drive light emitting device, above a thin film transistor, a light emitting element having an anode, a layer comprised of an organic compound and a cathode containing an alkali metal is formed between a third insulating layer comprised of silicon nitride or silicon oxynitride and a fourth insulating layer containing carbon as its main constituent. The light emitting element is formed between partition layers that are formed of an insulating material and have an inverse tapered shape.

23 Claims, 10 Drawing Sheets

LIGHT EMITTING DEVICE COMPRISING A PARTITION LAYER HAVING AN OVERHANG SHAPE

BACKGROUND OF THE INVENTION

1. Field of the Invention

The present invention relates to a phosphor in which luminescence generated by applying electric field (electro luminescence) and to a light emitting device using the phosphor. In particular, the present invention relates to a light emitting device in which an organic compound is used for a phosphor. Fluorescence and phosphorescence are included in the electro luminescence. The present invention relates to a light emitting device to which light emission by one or both of the fluorescence and phosphorescence is applied.

2. Description of the Related Art

A back light or a front light is used as the typical form of a display device using liquid crystal, and the structure is such that an image is displayed by means of the light. The liquid crystal display device is adopted as an image displaying means in various electronic devices, but has a defect from the viewpoint of its structure that a viewing angle is narrow. On the contrary, a display device using a phosphor in which electro luminescence is obtained has a wide viewing angle and is excellent in visibility. Thus, the display device using a phosphor has attracted attention as the display device in the next generation.

A light emitting element in which an organic compound is used for a phosphor (hereinafter referred to as organic light emitting element) is structured by appropriately combining a hole injecting layer, a hole transporting layer, a light emitting layer, an electron transporting layer, and an electron injecting layer, which are formed by the organic compound, between a cathode and an anode. Here, the hole injecting layer and the hole transporting layer are separately shown, but these are the same in a meaning that a hole transporting property (hole mobility) is particularly an important characteristic. In order to distinguish these layers for convenience, the hole injecting layer indicates the layer that contacts the anode, and the layer that contacts the light emitting layer is referred to as the hole transporting layer. Further, the layer that contacts the cathode is referred to as the electron injecting layer, and the layer that contacts the light emitting layer is referred to as the electron transporting layer. The light emitting layer may also serve as the electron transporting layer, and thus, is also referred to as a light emitting electron transporting layer. The light emitting element formed by combining these layers shows a rectification characteristic, and has the same structure as a diode.

The light emitting mechanism is considered such that an electron injected from the cathode and a hole injected from the anode are recombined in a layer comprised of a phosphor (light emitting layer) to form an exciton, and the exciton emits light when returning to a base state. There are emission of light from a singlet excitation state (fluorescence) and emission of light from a triplet excitation state (phosphorescence). Luminance reaches several thousands to several tens of thousands $cd/m^2$. Thus, it is considered that the light emission mechanism can be applied to a display device and the like in principle. However, various types of deterioration phenomena exist, and remain as a problem that impedes putting of the display device and the like to practical use.

The deterioration of the phosphor comprised of the organic compound or the organic light emitting element is considered to arise from the five factors mentioned below. The factors are (1) chemical deterioration of the organic compound (through the excitation state), (2) melting of the organic compound due to heat generation at the time of drive, (3) dielectric breakdown caused by a macro defect, (4) deterioration of an electrode or an interface of the electrode and an organic layer and (5) deterioration that arises from instability in an amorphous structure of the organic compound.

The above factors (1) to (3) are caused by driving the organic light emitting element. Heat is inevitably generated by such that a current in the element is converted into Joule heat. It is considered that melting occurs when the melting point or the glass transition temperature of the organic compound is low. Further, electric field is concentrated on the portion where a pin hole or a scratch exists, whereby the dielectric breakdown occurs. As to the factors (4) and (5), the deterioration progresses even if the phosphor comprised of the organic compound or organic light emitting element is preserved at a room temperature. The factor (4) is known as a dark spot, and arises from oxidization and reaction with moisture of a cathode. As to the factor (5), the organic compound used in the organic light emitting element is an amorphous material, and it is considered that almost no amorphous material exists in which the amorphous structure is kept stable since amorphous materials are crystallized by the long preservation, change through the elapse of time and heat generation.

The dark spot has been considerably suppressed because of the improvement of a sealing technique. However, the actual deterioration is occurred with the combination of the above factors, and thus, it is difficult to commonly understand the actual deterioration. The typical sealing technique is known as a method of making an organic light emitting element formed on a substrate airtight by a sealing member and providing a drying agent in the space. However, it is considered that the phenomenon, in which not only the current flowing through the organic light emitting element but also the emission luminance are towered when a constant voltage is continuously applied, originates in the property of the organic compound.

A low molecular weight organic compound and a polymer organic compound are both known as an organic compound for forming an organic light emitting element. As one example of the low molecular weight organic compound, copper phthalocyanine (CuPc), or á-NPD (4,4'-bis-[N-(naphthyl)-N-phenyl-amino]biphenyl) or MTDATA(4,4',4"-tris(N-3-methylphenyl-N-phenyl-amino)triphenylamine), which is an aromatic amine-based material is known as the hole injecting layer, and tris-8-quinolinolate-aluminum complex ($Alq_3$) or the like is known as the light emitting layer. As the polymer organic light emitting material, polyaniline, polythiophene derivative (PEDOT) or the like is known.

It is considered that the low molecular weight organic compound formed by an evaporation method has remarkable variety in comparison with the polymer organic material from the viewpoint of the variety of materials. However, in any case, the organic compound constituted of only a basic structural unit is rare. There may be the cases where different kinds of the organic compounds are combined, an impurity is mixed into the organic compound in a manufacturing process, and various additives such as a pigment are added to the organic compound. Further, among these materials, a material deteriorated due to moisture, a material easily oxidized and the like are included. Moisture and oxygen can be easily mixed from an atmosphere. Thus, care needs to be taken in handling the materials.

It is known that chemical bond is changed into double bond and the structure containing oxygen (—OH, —OOH, >C=O, —COOH and the like) when the organic compound is subjected to light deterioration. Therefore, in the case where the organic compound is provided in the atmosphere containing oxygen, or in the case where oxygen or $H_2O$ as an impurity is included in the organic compound, it is considered that the bond state changes, and the deterioration is promoted.

In the field of a semiconductor technique, in a semiconductor element having semiconductor junction, such as a diode, an impurity that arises from oxygen forms a local level in a forbidden band, which is a cause of junction leakage reduction and lifetime of or carrier. Thus, it is known that the impurity remarkably reduces the characteristics of the semiconductor element.

Oxygen molecules are peculiar molecules in a base state and also in a triplet state since a highest occupied molecular orbital (HOMO) is in condensation polymerization. Generally, the excitation process from triplet to singlet is forbidden transition (spin forbidden), and thus, is hard to occur. Therefore, oxygen molecules in the singlet state are not generated. However, when the molecules in the triplet excitation state ($^3M^*$) that is a state with higher energy than that of the singlet state exist around the oxygen molecules, energy transfer such as the following occurs. Thus, the reaction in which the oxygen molecules in the singlet state are generated can be found.

$$^3M^* + {}^3O_2 \rightarrow {}^1M + O_2 \qquad \text{Formula 1}$$

It is said that 75% of the excitation state of molecules in a light emitting layer of an organic light emitting element corresponds to the triplet state. Therefore, in the case where oxygen molecules are mixed in the organic light emitting element, the oxygen molecules in the singlet state can be generated by the energy transfer in the formula 1. The oxygen molecules in the singlet excitation state have ion properties (there is polarization in electric charge). Thus, it is considered there is a possibility that the oxygen molecules react with the charge polarization generated in the organic compound.

For example, since a methyl group is electron donor in basocuproin (hereinafter referred to as BCP), carbon directly bonded to a conjugate ring is electrified in positive. As shown in the following chemical formula 1, singlet oxygen having ion properties reacts with oxygen molecules in positive electrification if the oxygen molecules exist. Thus, there is a chemical formula 2. As a result, it is expected that the electron transporting property is lowered.

Chemical formula 1

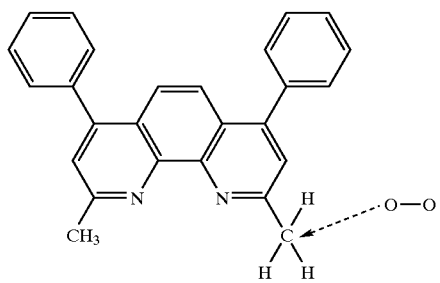

Chemical formula 2

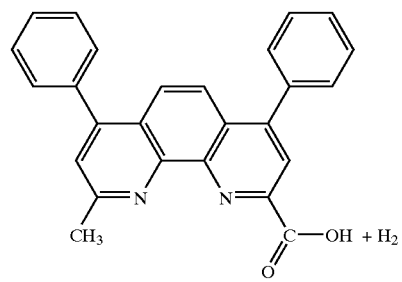

The present inventor has found that an impurity such as oxygen or $H_2O$ contained in an organic compound causes various types of deterioration such as reduction of luminance in an organic light emitting element and an organic light emitting device using the same based on the study described above.

In the organic light emitting element having the layer comprised of the organic compound between a cathode and an anode, and in the light emitting device structured using the organic light emitting element, it is necessary to reduce oxygen concentration that brings about the reduction of luminance and deterioration of an electrode material, such as a dark spot.

A preferred applied example using the organic light emitting element is an active matrix drive light emitting device, in which a pixel portion is formed in the organic light emitting element. A thin film transistor (hereinafter referred to as TFT) as an active element is provided in each pixel. However, it is known that characteristic values such as threshold voltage fluctuate due to contamination of an alkali metal with respect to the TFT formed using a semiconductor film. In the present invention, an appropriate structure for forming the pixel portion by combining the organic light emitting element, in which an alkali metal with a small working function is used in a cathode, and the TFT is required.

The active matrix drive light emitting device in which the pixel portion is formed by combining the organic light emitting element and the TFT is structured by appropriately combining a semiconductor material containing silicon as its main constituent and an inorganic or organic insulating material containing silicon as its constituent. The external quantum efficiency of the organic light emitting element does not still reach 50%. Thus, most of injected carriers are converted into heat, whereby the light emitting element is heated. As a result, thermal stress is applied to the light emitting element and acts on the respective layers forming a pixel. There occurs a defect that a crack is generated if the thermal stress is large.

SUMMARY OF THE INVENTION

The present invention has been made in view of the above and an object of the present invention is therefore to prevent deterioration that arises from chemical and physical factors in a light emitting device and to improve the reliability.

In order to prevent the deterioration of the light emitting device, the present invention is characterized in that an impurity containing oxygen, such as oxygen or $H_2O$ which is contained in an organic compound that forms an organic light emitting element is reduced. Of course, oxygen, hydrogen and the like are included as the structural elements of the organic compound. However, in the present invention, the impurity to the organic compound refers to an extrinsic impurity which is not included in the original molecular structure. Such an impurity is considered to be present in the organic compound as an atomic impurity, a molecular impurity, a free radical or an oligomer.

Further, according to the present invention, in the active matrix drive light emitting device, the structure for preventing fluctuation of a threshold voltage due to contamination of a TFT by an alkali metal such as sodium or potassium is provided.

According to the present invention, such an impurity is removed, and the impurity concentration of the layers formed of the organic compound that is used for forming the organic light emitting element, such as a hole injecting layer, a hole transporting layer, a light emitting layer, an electron transporting layer and an electron injecting layer is reduced to $5\times10^{19}$ atoms/cm$^3$ or less, preferably, $1\times10^{19}$ atoms/cm$^3$ or less as the average concentration. In particular, it is required that the oxygen concentration in the light emitting layer and in the vicinity thereof is reduced.

When the organic light emitting element emits light with luminance of 1000 Cd/cm$^2$, if this is converted into photons, the resultant corresponds to an emission amount of $10^{16}$ photons/see cm$^2$. Assuming that the quantum efficiency of the organic light emitting element is 1%, a current density of 100 mA/cm$^2$ is required. In accordance with an empirical rule based on a semiconductor element such as a solar battery or a photo diode using an amorphous semiconductor, the defect level density needs to be set to $10^{16}$ atoms/cm$^2$ or less in order to obtain satisfactory characteristics in the element through which the above current flows. For realizing the value, it is required that the concentration of a vicious impurity element forming the defect level is reduced to $5\times10^{19}$ atoms/cm$^3$ or less, preferably, $1\times10^{19}$ atoms/cm$^3$ or less as described above.

In order to reduce the impurity of the organic compound forming the organic light emitting element, a manufacturing device for forming the organic light emitting element comprises the following structure.

In an evaporation device for forming a layer comprised of a low molecular weight organic compound, wall surfaces of the inside of a reaction chamber is made specular by electropolishing to reduce a gas emission amount. Stainless steel or aluminum is used as the material for the reaction chamber. For the purpose of preventing the gas emission from the inner walls, a heater is provided outside the reaction chamber and a baking process is conducted. The gas emission can be considerably reduced by the baking process. Further, cooling is preferably conducted by means of a coolant at the time of evaporation. A turbo molecular pump and a dry pump are used for an exhaust system, and reverse diffusion of oil vapor from the exhaust system is prevented. Moreover, a cryopump may be provided in order to remove remaining H$_2$O.

An evaporation source is basically resistance heating type, but Knudsen cell may be used. A material for evaporation is brought into from a load lock type exchanging chamber attendant on the reaction chamber. Thus, the exposure to an atmosphere of the reaction chamber is avoided as much as possible at the time of loading the material for evaporation. The evaporation source is mainly comprised of the organic material, and the purification by sublimation is performed at the inside of the reaction chamber before evaporation. In addition, a zone refining method may be applied.

With respect to the pre-processing of a substrate to be introduced into the reaction chamber, gas emission processing by heating and plasma processing using argon are conducted, and thus, the impurity emitted from the substrate is reduced as much as possible. In the active matrix drive light emitting device, a TFT is formed in advance on the substrate on which the organic light emitting element is to be formed. In the case where an insulating layer, etc. using an organic resin material are appropriately used as the structural components of the substrate, it is necessary to reduce gas emission from the member. Further, nitrogen gas or argon gas, which is introduced into the reaction chamber, is refined at a supply port.

On the other hand, in the case where a layer comprised of a polymer organic compound is formed, control on degree of polymerization cannot be completely conducted, and thus, a range of molecular weight develops. Therefore, the melting point may not be determined with only one meaning. A dialysis or high-performance liquid chromatography is appropriate for such a case. Particularly, in the dialysis, an electrodialysis is suitable for efficiently removing an ion impurity.

In an active matrix drive method in which a pixel portion is formed by an organic light emitting element formed as described above and each pixel is controlled by an active element, one embodiment of the structure is such that a TFT having a semiconductor film, a gate insulating film and a gate electrode is formed on a substrate and an organic light emitting element is formed above the TFT. A typified example of the substrate to be used is a glass substrate, and a small amount of alkali metal is contained in barium borosilicate glass or alumino borosilicate glass. The semiconductor film is coated by silicon nitride or silicon oxynitride in order to prevent contamination due to the alkali metal from the glass substrate on the lower layer side and the organic light emitting element on the upper layer side.

On the other hand, the organic light emitting element that is desirably formed on the leveled surface is formed on a leveling film comprised of an organic resin material such as polyimide or acrylic. However, such an organic resin material has hygroscopic property. The organic light emitting element that is deteriorated by oxygen or H$_2$O is coated with silicon nitride, silicon oxynitride or diamond-like carbon (DLC) having a gas-barrier property.

FIG. 12 is a diagram explaining the concept of the active matrix drive light emitting device according to the present invention. As the structural components of a tight emitting device 1200, a TFT 1201 and an organic light emitting element 1202 are formed on the same substrate. The structural components of the TFT 1201 are a semiconductor film, a gate insulating film, a gate electrode and the like, and the elements contained in those are silicon. hydrogen, oxygen, nitrogen, metal forming a gate electrode, and the like. On the other hand, the organic light emitting element 1202 contains an alkali metal such as lithium as the element in addition to carbon that is a main structural component of an organic compound material.

Silicon nitride or silicon oxynitride 1205 is formed as a blocking layer on the lower layer side of the TFT 1201 (glass substrate 1203 side). Silicon oxynitride 1206 is formed as a protective film on the opposite and upper layer side. On the other hand, silicon nitride or silicon oxynitride 1207 is formed as a protective film on the lower layer side of the organic light emitting element 1202. As the protective film, aluminum oxide, aluminum nitride, aluminum oxynitride can also be applied. A DLC film 1208 is formed as a protective film on the upper layer side.

An organic resin interlayer insulating film 1204 is formed between the TFT and the organic light emitting element and is integrated therewith. The alkali metal such as sodium that most easily affects the TFT 1201 is blocked by the silicon nitride or silicon oxynitride 1205 or the silicon oxynitride 1206. On the other hand, since the organic light emitting element 1202 most dislikes oxygen or $H_2O$, the silicon nitride or silicon oxynitride 1207 and the DLC film 1208 are formed in order to block oxygen or $H_2O$. Further, the silicon nitride or silicon oxynitride 1207 and the DLC film 1208 have functions of not letting the alkali metal element of the organic light emitting element 1202 out.

As described above, the light emitting device structured by combining the TFT with the organic light emitting element is formed by cleverly combining the insulating films having a blocking property against oxygen or $H_2O$ in order to satisfy opposite properties with respect to impurity contamination.

With the above-described structural components as the basis, the light emitting element having an anode, an organic compound layer, and a cathode containing an alkali metal is formed between partition layers comprised of an insulating material. The partition layer has a shape in which the upper portion protrudes in a direction parallel to the substrate (so-called overhang shape) and takes a structure in which the organic compound layer and the cathode layer of the organic light emitting element do not contact with each other.

The organic compound material forming the light emitting element is refined, the impurity mixing is prevented in the film formation, and the organic compound layer is highly purified, whereby the reduction of luminance and the deterioration of the cathode layer can be prevented. Further, an inorganic insulating layer comprised of silicon nitride or silicon oxynitride or the like is provided between the light emitting element and the TFT, and thus, the alkali metal element forming the cathode layer can be prevented from diffusing into the semiconductor film that constitutes the TFT. In the light emitting element, the partition layer has the overhang shape, and the structure is taken in which the organic compound layer and the cathode layer of the organic light emitting element do not contact with each other. Thus, thermal stress acts on the respective layers that constitute the light emitting device with the thermal stress, and the generation of physical damage such as a crack can be prevented. With the above action, the reliability of the light emitting device can be enhanced.

Note that the light emitting device throughout this specification indicates the whole devices using the phosphor. Further, a module in which an element having a layer comprising the phosphor between an anode and a cathode (hereinafter referred to as light emitting element) is attached with a TAB (tape automated bonding) tape or a TCP (tape carrier package), a module in which a printed wiring board is attached to the end of the TAB tape or the TCP, or a module in which an IC is mounted to the substrate, on which the light emitting element is formed, by a COG (chip on glass) method are all included in the light emitting devices.

Further, the concentration of oxygen as the impurity element in this specification indicates the minimum concentration measured by a secondary ion mass spectrometry (SIMS).

DETAILED DESCRIPTION OF THE PREFERRED EMBODIMENTS

Embodiment 1

Figure 1:
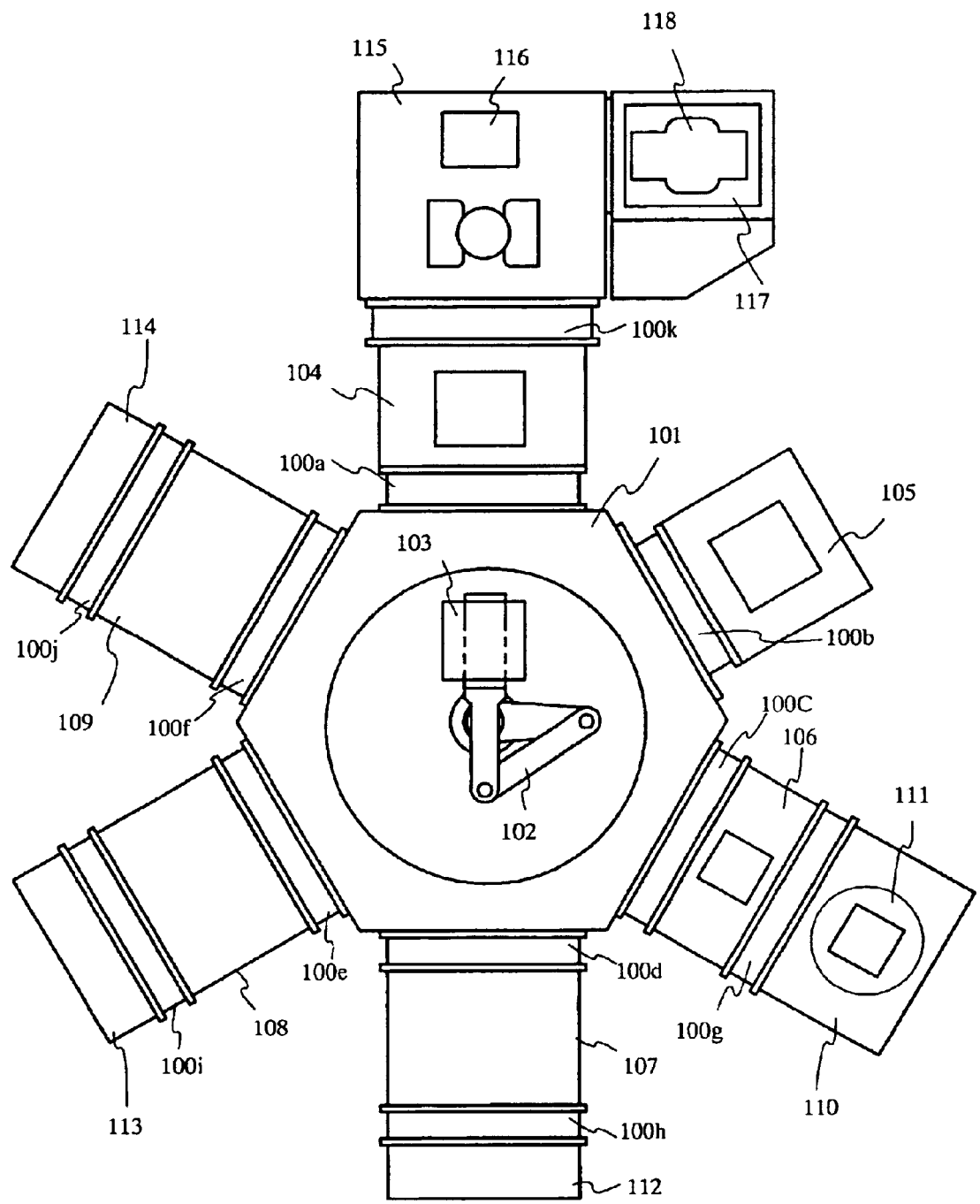
FIG. 1 is a diagram explaining a structure of a film forming device of the present invention.

One example of an organic light emitting element manufacturing device in which the concentration of an impurity such as oxygen or $H_2O$ which is contained in an organic compound can be reduced is explained with reference to FIG. 1. FIG. 1 shows a device for conducting the formation of a layer comprised of an organic compound and a cathode and conducting sealing. A conveying chamber 101 is coupled to a load chamber 104, a pre-processing chamber 105, a middle chamber 106, film forming chambers 107 to 109 through gates 100*a* to 100*f*, respectively. The pre-processing chamber 105 is provided with the purpose of processing of releasing gas and surface reforming of a substrate to be processed, and a heating process in vacuum and a plasma process using an inert gas are possible in the pre-processing chamber 105.

The film forming chambers 107 and 108 are processing chambers for forming a film mainly comprised of a low molecular weight organic compound by an evaporation method, and the film forming chamber 109 is a processing chamber for forming a cathode containing an alkali metal by the evaporation method. The film forming chambers 107 to 109 are connected to material exchanging chambers 112 to 114 for loading a material for evaporation into an evaporation source through gates 100*h* to 100*j*. The material exchanging chambers 112 to 114 are used for loading the evaporation material while the film forming chambers 107 to 109 not being exposed to an atmosphere.

First, a substrate 103 on which a film is deposited is mounted to the load chamber 104, and is moved to the pre-processing chamber or respective reaction chambers by a conveying mechanism (A) 102 in the conveying chamber 101. The load chamber 104, the conveying chamber 101, the preprocessing chamber 105, the middle chamber 106, the film forming chambers 107 to 109 and the material exchanging chambers 112 to 114 are kept in a decompression state by an exhaust means. As to the exhaust means, vacuum exhaust is performed with a degree of approximately 1 Pa from an atmospheric pressure by an oil-free dry pump, and the pressure more than the above is vacuum-exhausted by a magnetic levitation type turbo molecular pump or composite molecular pump. The reaction chamber may be provided with a cryopump in order to remove $H_2O$. Thus, reverse diffusion of oil vapor from the exhaust means is prevented.

Inner wall surfaces of the chamber in which the vacuum exhaust is conducted are subjected to specular processing by electropolishing, and the surface area is reduced to prevent gas emission. Stainless steel or aluminum is used as the material for the inner wall surfaces. It is desirable that a heater is provided outside the reaction chamber and a baking process is conducted for the purpose of reducing the gas emission from the inner walls. The gas emission can be considerably reduced by the baking process. Further, cooling may be conducted using a coolant at the time of evaporation in order to prevent impurity contamination due to the gas emission. Thus, the degree of vacuum of $1\times10^{-6}$ Pa is realized.

The middle chamber 106 is connected to an application chamber 110 provided with a spinner 111 through a gate 110g. The application chamber 110 is a processing chamber for forming a film formed of an organic compound mainly comprised of a polymer material by a spin coating method. This process is conducted at the atmospheric pressure. Therefore, carrying out and bringing in the substrate are conducted through the middle chamber 106, and this is conducted by adjusting the pressure of the middle chamber 106 to the pressure of the chamber to which the substrate is moved. The polymer organic material to be supplied to the application chamber is refined by dialysis, electrodialysis or high-performance liquid chromatography to thereby be supplied. The refinement is performed at a supply port.

With respect to the pre-processing of the substrate to be introduced into the reaction chamber, gas emission processing by heating and surface processing by argon plasma are conducted in the pre-processing chamber 105 to reduce the impurity emitted from the substrate as much as possible. Particularly in the case where an interlayer insulating film comprised of an organic resin material or a pattern is formed on the substrate, $H_2O$ or the like occluded by the organic resin material is emitted under decompression, and thus, the inside of the reaction chamber is contaminated. Therefore, the gas emission processing is conducted by heating the substrate or the surface is made close by performing plasma processing in the pre-processing chamber 105, whereby the gas emission amount is reduced. Here, nitrogen gas and argon gas which are introduced into the reaction chamber are refined by a refining means using a getter material.

The evaporation method is resistance heating type. However, Knudsen cell may be used for controlling temperature with high precision and controlling an evaporation amount. The material for evaporation is introduced from a dedicated material exchanging chamber attendant on the reaction chamber. Thus, the exposure to an atmosphere of the reaction chamber is avoided as much as possible. The film forming chamber is exposed to an atmosphere, whereby various gases such as $H_2O$ are adsorbed into the inner walls. Then, the gases are emitted again by conducting vacuum exhaust. Several tens to several hundred hours are required for the time until the emission of the adsorbed gas is settled and the degree of vacuum becomes stable at an equilibrium value. Therefore, the time required is reduced by conducting the baking process to the walls of the film forming chamber. However, repeating the exposure to the atmosphere is not efficient. Thus, it is desirable that the dedicated material exchanging chamber is provided as shown in FIG. 1. The evaporation source is mainly comprised of the organic material, but the sublimation purification is performed at the inside of the reaction chamber before evaporation. In addition a zone refining method may be applied.

On the other hand, in a sealing chamber 115 separated by the load chamber 104, processing for sealing the substrate completed through the formation of the cathode by a sealing member without being exposed to the atmosphere is performed. An ultraviolet irradiation mechanism 116 is used for the sealing member in the case where an ultraviolet cured resin is used for fixing. A delivering chamber 117 is provided with a conveying mechanism (B) 118 and stores the substrate completed through the sealing in the sealing chamber 115.

Figure 2:
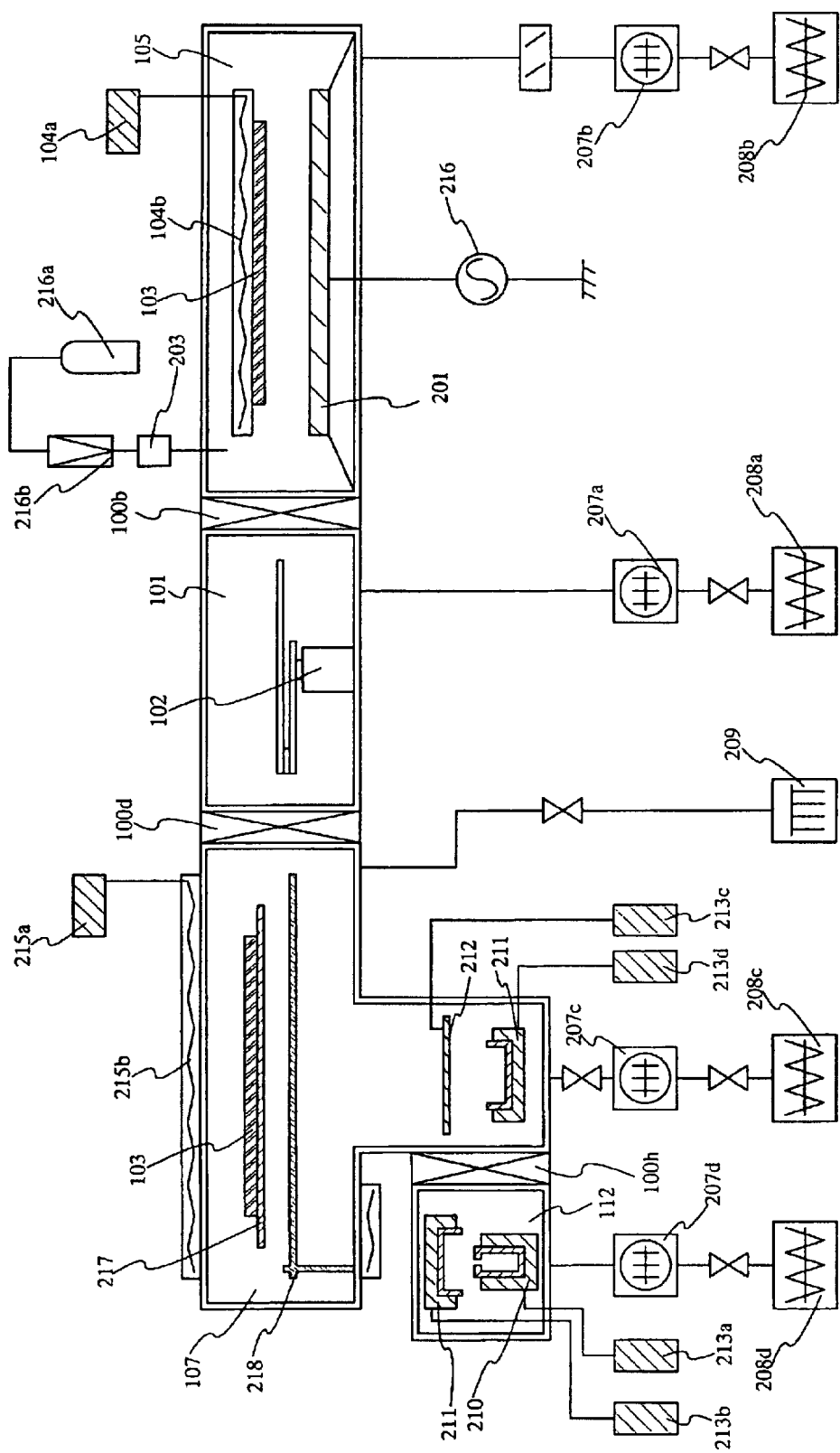
FIG. 2 is a diagram explaining a structure of the film forming device of the present invention.

FIG. 2 is a diagram explaining the detailed structure of the conveying chamber 101, the pre-processing chamber 105 and the film forming chamber 107. The conveying chamber 101 is provided with the conveying means 102, a composite molecular pump 207a, and a dry pump 208a as the exhaust means. The pre-processing chamber 105 and the film forming chamber 107 are coupled to the conveying chamber 101 through the gates 100b and 100d, respectively. The pre-processing chamber 105 is provided with a high frequency electrode 201 connected with a high frequency power source 216, and the substrate 103 is held by an opposing electrode provided with substrate heating means 104a and 104b. The impurity such as moisture adsorbed on the substrate 103 can be desorbed by heating the substrate in vacuum at about 50 to 120° C. with the substrate and heating means. A gas introducing means connected to the pre-processing chamber 105 is constituted of a cylinder 216a, a flow controller 216b and a refiner 203 formed by a getter material and the like.

Surface processing by plasma is conducted by such that an inert gas such as helium, argon, krypton or neon, or a gas in which the inert gas is mixed with hydrogen is refined by the refiner 203 and that the substrate is exposed into an atmosphere made into plasma by applying high frequency power. The purity of the gas to be used is 2 ppm or less, preferably 1 ppm or less with respect to the concentration of each of $CH_4$, $CO$, $CO_2$, $H_2O$ and $O_2$.

The exhaust means is composed of a magnetic levitation type composite molecular pump 207b and a dry pump 208b. Pressure control in the pre-processing chamber 105 at the time of surface processing is conducted by controlling an exhaust speed by a control valve provided in the exhaust means.

The film forming chamber 107 is provided with an evaporation source 211, an adsorption plate 212, a shutter 218 and a shadow mask 217. The substrate 103 is provided on the shadow mask 217. The shutter 218 opens at the time of evaporation in an opening and shutting manner. The evaporation source 211 and the adsorption plate 212 are controlled with respect to temperature, and are connected to heating means 213d and 213c, respectively. An exhaust system corresponds to the turbo molecular pump 207c and the dry pump 208c, and the exhaust system and a cryopump 209 enable removal of residual moisture in the film forming chamber. In the reaction chamber, it is possible to reduce the amount of gas emitted from the inner walls of the film forming chamber by conducting the baking process using the heating means 215a and 215b. In the baking process, vacuum exhaust is conducted by the exhaust system connected to the turbo molecular pump or cryopump while the reaction chamber is heated at about 50 to 120° C. Thereafter, the reaction chamber is cooled to a room temperature or approximately to the temperature of liquid nitrogen by a coolant, whereby the vacuum exhaust to about $1\times10^{-6}$ Pa is possible.

The material exchanging chamber 112 separated by the gate 100h is provided with the evaporation sources 210 and 211, and its temperature is controlled by the heating means 213a and 213b. A turbo molecular pump 207d and a dry pump 208d are used for an exhaust system. The evaporation source 211 is movable between the material exchanging chamber 112 and the film forming chamber 107, and is used as a means for refining the material for evaporation to be supplied.

There is no limitation on a method of refining the material for evaporation, but it is preferable to adopt the sublimation refining method in order to conduct the refinement in the film forming device. Of course, the zone refining method may also be performed. FIG. 3 and FIGS. 4A to 4C are diagrams explaining a method of conducting sublimation purification in the film forming device described in FIG. 2.

Many organic compounds for forming an organic light emitting element are deteriorated by oxygen or $H_2O$. Particularly, the tendency is conspicuous with respect to the low molecular weight organic compound. Therefore, even if the organic compound is sufficiently refined and highly purified in the beginning, there is a possibility that oxygen or $H_2O$ is easily taken into the organic compound in accordance with later handling. As described above, oxygen taken into the organic compound is considered to be a vicious impurity that changes the bond state of molecules. The impurity is a cause of the change through the elapse of time and deterioration of the characteristics of the organic light emitting element.

Figure 3:
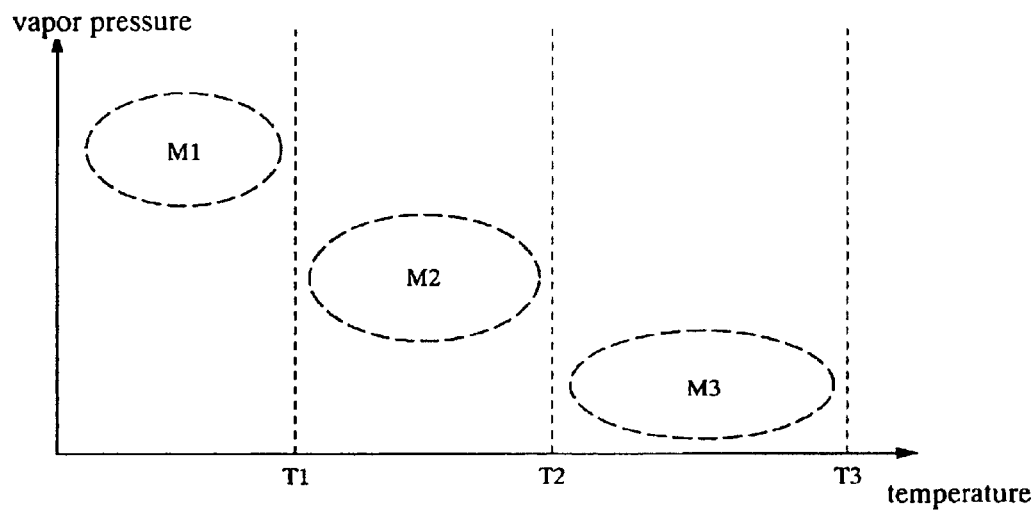
FIG. 3 is a diagram explaining a relationship between an impurity contained in an organic compound material and a vapor pressure thereof.

FIG. 3 is a diagram explaining the concept of sublimation purification of the organic compound material. Assuming that the organic compound that is the original objective is represented by M2 and the vapor pressure under a certain constant pressure exists between temperatures T1 and T2. The organic compound with a vapor pressure at a temperature lower than T1 is represented by M1, and the impurity such as $H_2O$ corresponds to M1. Further, M3 that is the organic compound with a vapor pressure at a temperature higher than T2 corresponds to an impurity such as a transition metal or an organic metal.

Figures 4A, 4B:
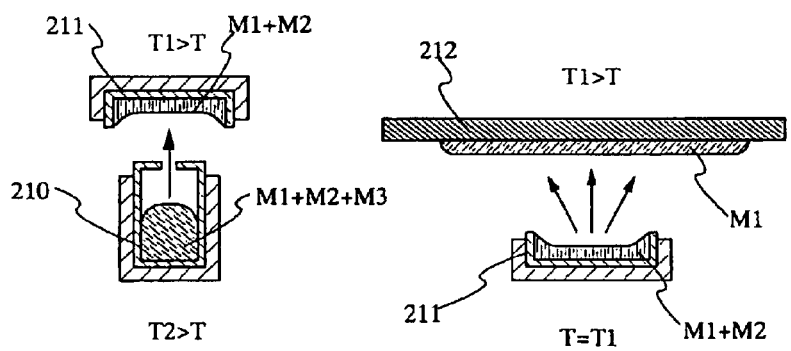
FIGS. 4A to 4C are diagrams explaining a method of conducting sublimation purification in the film forming device.

As described above, the material containing M1, M2 and M3 with different vapor pressures, respectively, is put into the first evaporation source 210, and is heated at the temperature lower than T2 as shown in FIG. 4A. The materials that sublime from the first evaporation source are M1 and M2. At this time, if the second evaporation source 211 is provided above the first evaporation source 210 and is kept at the temperature lower than T1, the materials can be adsorbed into the second evaporation source 211. Next, as shown in FIG. 4B, when the second evaporation source 211 is heated at the temperature of T1, M1 sublimes and is adsorbed into the adsorption plate 212. M1 and M3 are removed and M2 remains in the second evaporation source 211. Thereafter, as shown in FIG. 4C, the second evaporation source 211 is heated at the temperature of approximately T2 to form a layer of the organic compound on the substrate.

Figure 4C:
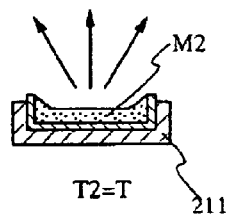

The process of sublimation purification shown in FIGS. 4A to 4C can be conducted in the material exchanging chamber 112 and the film forming chamber 107 in the film forming device described in FIG. 2. The degree of cleanliness in the film forming chamber is raised by mirror finishing of the inner walls or exhaust with the turbo molecular pump or the cryopump. Thus, the oxygen concentration in the organic compound evaporated on the substrate can be reduced to $5 \times 10^{19}$ atoms/cm$^3$ or less, preferably to $1 \times 10^{19}$ atoms/cm$^3$ or less.

Embodiment 2

The organic light emitting element manufactured by using the film forming device in Embodiment 1 is not limited in terms of structure. The organic light emitting element is composed of an anode formed of a conductive film with a light transmitting property, a cathode containing an alkali metal and a layer comprised of an organic compound therebetween. The layer comprised of the organic compound consists of one layer or a plurality of layers. The respective layers are separately referred to as a hole injecting layer, a hole transporting layer, a light emitting layer, an electron transporting layer, an electron injecting layer and the like in accordance with the purpose and function. These layers can be formed of either a low molecular weight organic compound material or a polymer organic compound material or formed by appropriately combining both the materials.

The organic compound material excellent in a hole transporting property is selected for the hole injecting layer or the hole transporting layer, and a phthalocyanine-based or aromatic amine-based material is typically adopted. Further, a metal complex or the like which is excellent in an electron transporting property is used in the electron injecting layer.

Figure 5A:
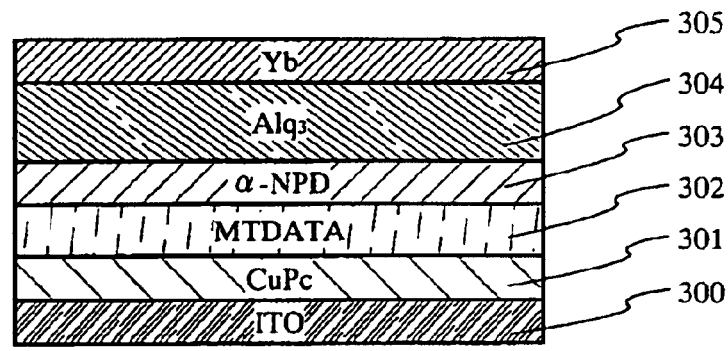
FIGS. 5A to 5C are diagrams explaining a structure of an organic light emitting element.
Figure 5B:
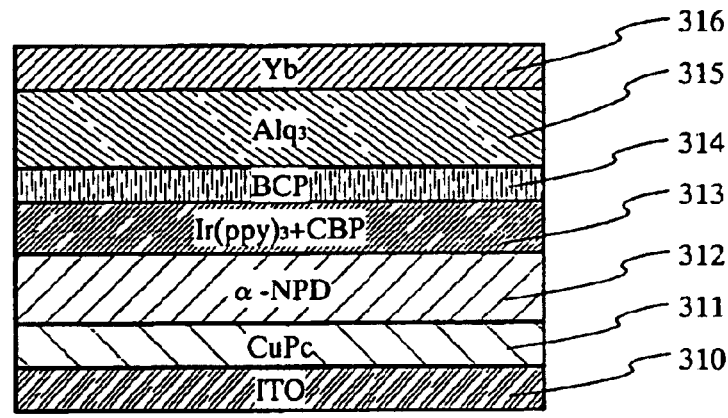
Figure 5C:
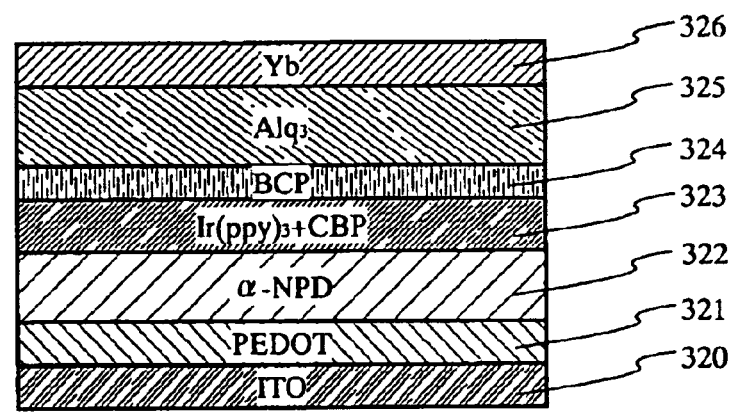

FIGS. 5A to 5C show an example of a structure of the organic light emitting element. FIG. 5A shows an example of the organic light emitting element comprised of the low molecular weight organic compound, and an anode 300 formed of indium-tin oxide (ITO), a hole injecting layer 301 formed of copper phthalocyanine (CuPc), hole transporting layers 302 and 303 formed of MTDATA and á-NPD which are aromatic amine-based materials, an electron injecting and light emitting layer 304 formed of tris-8-quinolinolate-aluminium complex (Alq$_3$) and a cathode 305 formed of ytterbium (Yb) are laminated. Alq$_3$ enables emission from a singlet excitation state (fluorescence).

It is preferable to use emission from a triplet excitation state (phosphorescence) in order to enhance luminance. FIG. 5B shows an example of such an element structure. In the element structure, a light emitting layer 313 is formed by using carbazole-based CBP+Ir (ppy)$_3$ on an anode 310 formed of ITO, a hole injecting layer 311 formed of CuPc that is a phthalocyanine-based material and a hole transporting layer 312 formed of á-NPD that is an aromatic amine-based material. Further, a hole blocking layer 314 is formed by using basocuproin (BCP), and an electron injecting layer 315 is formed by using, Alq$_3$.

The above two structures are examples in which the low molecular weight organic compound is used. However, the organic light emitting element formed by combining the polymer organic compound and the low molecular weight organic compound can be realized. FIG. 5C shows an example thereof, and a hole injecting layer 321 is formed of polythiophene derivative (PEDOT) that is the polymer organic compound, a hole transporting layer 322 is formed of á-NPD, a light emitting layer 323 is formed of CBP+Ir (ppy)$_3$, a hole blocking layer 324 is formed of BCP, and an electron injecting layer 325 is formed of Alq$_3$. The adoption of the hole injecting layer formed of PEDOT enables the improvement of a hole injecting property, which leads to the improvement of emission efficiency.

Carbazole-based CBP+Ir (ppy)$_3$ used for the light emitting layer is an organic compound in which the emission from the triplet excitation state (phosphorescence) can be obtained. The organic compounds described in the following theses can be given as the typical triplet compounds. (1) T. Tsutsui, C. Adachi, S. Saito, Photochemical Processes in Organized Molecular Systems, ed. K. Honda, (Elsevier Sci. Pub., Tokyo, 1991) p. 437. (2) M. A. Baldo, D. F. O'Brien, Y. You, A. Shoustikov, S. Sibley, M. E. Thompson, S. R. Forrest, Nature 395 (1998) p. 151. The organic compound shown by the following formula is disclosed in this thesis.
(3) M. A. Baldo, S. Lamansky, P. E. Burrows, M. E. Thompson, S. R. Forrest, Appl. Phys. Lett., 75 (1999) p. 4.
(4) T. Tsutsui, M. J. Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.

Further, in addition to the tight emitting materials described in the above theses, the light emitting material expressed by the following molecular formulae (specifically, metal complex or organic compound) can be used.

Chemical Formula 3

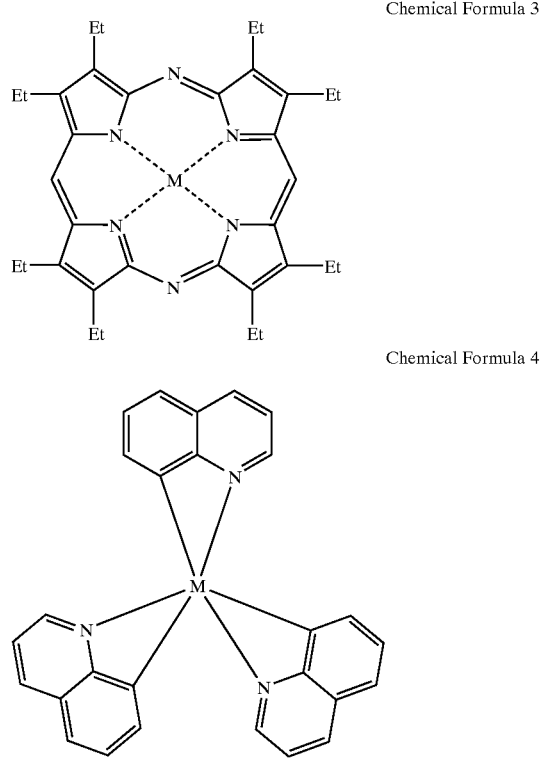

Chemical Formula 4

In the above molecular formulae, M indicates an element that belongs to Groups 8 to 10 of the periodic table, Et indicated an ethyl group. In the above theses, platinum and iridium are used. Further, the inventors considers that nickel, cobalt and palladium are preferable in the reduction of manufacturing cost of a display device since they are cheaper than platinum or iridium. In particular, nickel is considered to be preferable because nickel is easy to form complex and has high productivity. In any case, the emission from the triplet excitation state (phosphorescence) has higher emission efficiency than the emission from the singlet excitation state (fluorescence), and thus, can lower operation voltage (voltage required for emission of the organic light emitting element) in obtaining the same emission luminance.

Phthalocyanine-based CuPc, aromatic amine-based á-NPD and MTDATA, carbazole-based CBP and the like are the organic compounds in which oxygen is not included in the molecules. When oxygen or $H_2O$ is mixed into such an organic compound the change of the bond state as described using the chemical formulae 1 and 2 occurs which leads to the deterioration of a hole transporting property and a light emitting property. In the formation of the layer of such an organic compound, the film forming device and the film forming method, which are described using FIGS. 1 to 3 in Embodiment 1, are adopted. Thus the oxygen concentration of the light emitting element can be set to $1\times10^{19}$ atoms/cm$^3$ or less. Alternatively, in the organic light emitting element having the phthalocyanine-based or aromatic amine-based hole injecting layer or hole transporting layer or the carbazole-based light emitting layer, the oxygen concentration of the hole injecting layer or hole transporting layer and in the vicinity thereof can be set to $1\times10^{19}$ atoms/cm$^3$ or less.

Embodiment 3

Figure 6:
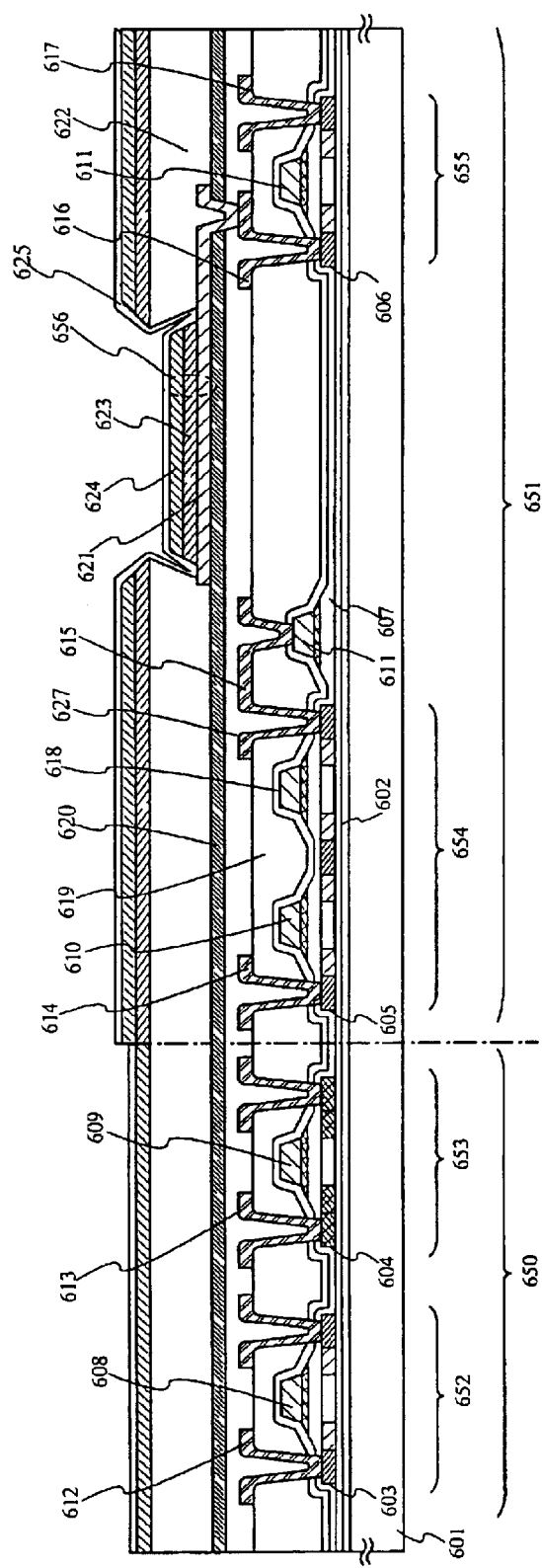
FIG. 6 is a fragmentary sectional view explaining a structure of an organic light emitting device provided with a pixel portion and a driver circuit portion.

FIG. 6 shows an example of a structure of an active matrix drive light emitting device. TFTs are provided in a pixel portion and various function circuits in the vicinity thereof. With respect to the TFT, either amorphous silicon or polycrystalline silicon can be selected for the material of a semiconductor film that forms a channel forming region. In the present invention, any of amorphous silicon and polycrystalline silicon may be adopted.

A glass substrate or an organic resin substrate is adopted for a substrate 601. An organic resin material is lighter than a glass material, and thus, gives a good effect on the reduction in weight of the light emitting device itself. The organic resin materials such as polyimide, polyethylene terephthalate (PET), polyethylene naphthalate (PEN), polyether sulfone (PES) and aramide can be applied in manufacturing the light emitting device. Barium borosilicate glass or alumino borosilicate glass, which is called non-alkali glass, is desirably used for the glass substrate. The glass substrate with a thickness of 0.5 to 1.1 mm is adopted, but the thickness needs to be thinned in case of setting the purpose of attaining the reduction in weight. Further, it is desirable to adopt the glass substrate with a small specific gravity of 2.37 g/cc in order to further attain the reduction in weight.

In FIG. 6, an n-channel TFT 652 and a p-channel TFT 653 are formed in a driver circuit portion 650. A switching TFT 654 and a current control TFT 655 are formed in a pixel portion 651. These TFTs are formed on a first insulating layer 602 comprised of silicon nitride or silicon oxynitride (expressed by $SiO_xN_y$) by using semiconductor films 603 to 606, a gate insulating film 607, gate electrodes 608 to 611 and the like.

A second insulating layer 618 comprised of silicon nitride or silicon oxynitride is formed above the gate electrodes and is used as a protective film. Further, a first interlayer insulating film 619 comprised of an organic resin material such as polyimide or acrylic is formed as a leveling film.

The circuit structure of the driver circuit portion 650 differs between a gate signal side driver circuit and a data signal side driver circuit, but is omitted here. The n-channel TFT 652 and the p-channel TFT 653 are connected to wirings 612 and 613, respectively, and a shift register circuit, a latch circuit, a buffer circuit and the like are formed using these TFTs.

In the pixel portion 651, a data wiring 614 is connected to the source side of the switching TFT 654, and a wiring 615 on the drain side is connected to the gate electrode 611 of the current control TFT 655. Further, the source side of the current control TFT 655 is connected to a power source supply wiring 617, and an electrode 616 on the drain side is connected to an anode of the light emitting element.

A second interlayer insulating film 627 comprised of an organic insulating material such as silicon nitride is formed on these wirings. The organic resin material is hygroscopic and has property in which $H_2O$ is occluded. When $H_2O$ is emitted again, oxygen is supplied to the organic compound, which becomes a cause of deterioration of the organic light emitting element. Thus, in order to prevent occlusion and re-emission of $H_2O$, a third insulating film 620 comprised of silicon nitride or silicon oxynitride is formed on the second interlayer insulating film 627. Alternatively, it is possible that the second interlayer insulating film 627 is omitted and only the third insulating film 620 is formed.

Further, aluminum oxide, aluminum nitride, aluminum oxynitride and the like can be applied to the third insulating film 620. The film formed of each of the above substances can be formed by a sputtering method using aluminum oxide or aluminum nitride as a target.

An organic light emitting element 656 is formed on the third insulating film 620 and is composed of an anode 621 formed of a transparent conductive material such as ITO (indium-tin oxide), an organic compound layer 623 having a hole injecting layer, a hole transporting layer, a light emitting layer and the like and a cathode 624 formed by using alkali metals or alkaline-earth metals such as MgAg and LiF. The detailed structure of the organic compound layer 623 is arbitrarily adopted, but an example thereof is shown in FIGS. 5A to 5C in Embodiment 2.

The organic compound layer 623 and the cathode 624 can not be subjected to a wet process (process such as etching with liquid medicine or washing in water). Thus, a partition layer 622 formed of a photosensitive resin material is provided on the organic insulating film 619 in accordance with the anode 621. The partition layer 622 is formed so as to cover an end portion of the anode 621. Specifically, the partition layer 622 is applied with a negative resist and is formed to have a thickness of approximately 1 to 2 $\mu$m after baking. Thereafter, a photo mask provided with a predetermined pattern is used, and ultraviolet rays are irradiated to thereby conduct exposure. If the negative resist material with low transmissivity is used, the ratio of the film exposed to light in the thickness direction changes. When the partition layer is developed, an end portion of the pattern can be made to have an inverse tapered shape as shown in FIG. 6. Of course, the partition layer may be formed using photosensitive polyimide.

Figure 8:
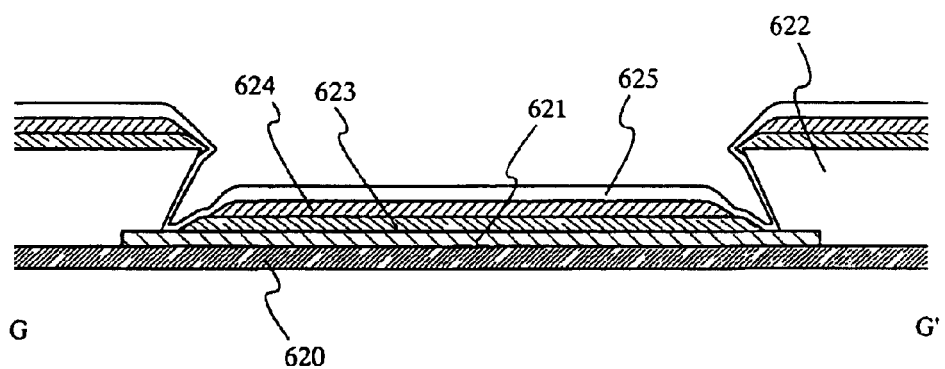
FIG. 8 is a cross sectional view explaining a structure of the pixel portion of the organic light emitting device.

FIG. 8 is a detailed diagram of a portion where the organic light emitting element is formed. After the end portion of the partition layer 622 is formed to have the inverse tapered shape, the organic compound layer 623 and the cathode layer 624 are formed by an evaporation method, whereby the organic compound layer 623 and the cathode layer 624 can be formed without turning under a bottom portion of the partition layer 622 that contacts the anode 621. Since the material for evaporation from the evaporation source adheres to the substrate with directivity in the evaporation method, the organic compound layer and the cathode layer can be formed on the cathode 621 with the state shown in FIG. 8 owing to the step of a top portion and the bottom portion of the partition layer 622 having the inverse tapered shape.

Figure 9:
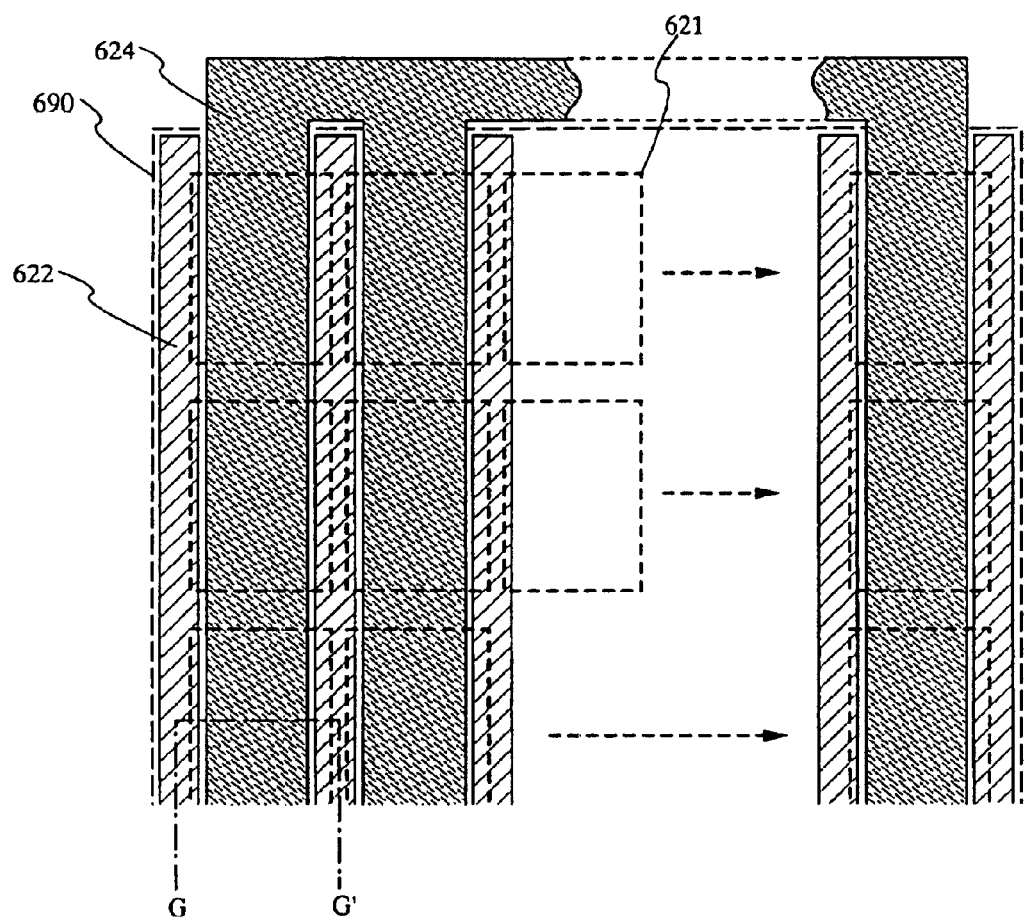
FIG. 9 is a top view explaining a structure of the pixel portion of the organic light emitting device.

Further, FIG. 9 is a top view explaining the structure of the pixel portion, and the cross-sectional structure of a G–G' line corresponds to FIG. 8. The anode 621 is separately formed in accordance with the TFT provided in each pixel. The partition layer 622 is formed so as to cover the end portion of the anode 621 and to have a stripe shape over a plurality of pixels. The organic compound layer is formed inside a region 690 surrounded by a dotted line by evaporation. The organic compound layer is formed in accordance with the partition layer 622 having the inverse tapered shape as shown in FIG. 8. The cathode 624 is similarly formed, but is formed so as to be coupled in the region external to the region where the partition layer 622 is formed, that is, the outside of the pixel portion.

A material containing magnesium (Mg), lithium (Li) or calcium (Ca) with a small working function is used for the cathode 624. An electrode formed of MgAg (the material in which Mg and Ag are mixed with a ratio of Mg:Ag=10:1) is preferably used MgAgAl. LiAl, LiFAl, magnesium, magnesium alloy and magnesium compound can also be applied. Further, a fourth insulating film 625 with a thickness of 2 to 30 nm, preferably 3 to 10 nm is formed on the cathode 624 by using silicon nitride or a DLC film. The DLC film can be formed by a plasma CVD method, and even if formed at a temperature of 100° C. or less, the DLC film can be formed covering the end portion of the partition layer 622 with a satisfactory covering property. The internal stress of the DLC film can be relaxed by mixing a small amount of oxygen or nitrogen into the DLC film, and the DLC film can be used as a protective film. Moreover, it is known that the DLC film has a high gas-barrier property with respect to oxygen, CO, $CO_2$ and $H_2O$. The fourth insulating film 625 is desirably formed in succession without exposure to an atmosphere after the cathode 624 is formed. This is because the interface state of the cathode 624 and the organic compound layer 623 has a great influence on the emission efficiency of the organic light emitting element.

As described above, the organic compound layer 623 and the cathode layer 624 are formed without contacting the partition layer 622 to form the organic light emitting element, whereby the generation of a crack due to thermal stress can be prevented. Further, since an organic light emitting element most dislikes oxygen and $H_2O$, silicon nitride or silicon oxynitride and a DLC film 625 are formed in order to block oxygen and $H_2O$. In addition, the silicon nitride or silicon oxynitridie and the DLC film 625 have also functions of not letting an alkali metal element of the organic light emitting element out.

In FIG. 6, the switching TFT 654 takes a multi-gate structure, and a low density drain (LDD) that overlaps the gate electrode is provided in the current control TFT 655. The TFT using polycrystalline silicon easily brings about deterioration due to hot carrier injection or the like because of the high operation speed. Therefore, the formation of the TFTs having different structures (the switching TFT with sufficiently low off current and the current control TFT that withstands the hot carrier injection) in accordance with functions in a pixel, as shown in FIG. 6, is extremely effective in manufacturing a display device which has high reliability and enables satisfactory image display (with high operation performance).

As shown in FIG. 6, the first insulating film 602 is formed on the lower layer side (substrate 601 side) of the semiconductor film that forms the TFTs 654 and 655. On the opposite and upper layer side, the second insulating film 618 is formed. On the other hand, the third insulating film 620 is formed on the lower layer side of the organic light emitting element 656. The fourth insulating film 625 is formed on the upper layer side. Further, the organic insulating film 619 is formed between the TFTs 654 and 655 side and the organic light emitting element 656 side to integrate both the sides. The substrate 601 and the organic light emitting element 656 are considered to be the contamination source of the alkali metal such as sodium that becomes a killer impurity to the TFTs 654 and 655. The TFTs 654 and 655 are surrounded by the first insulating film 602 and the second insulating film 618, whereby the killer impurity is blocked. On the other hand, since the organic light emitting element 656 most dislikes oxygen and $H_2O$, the third insulating film 620 and the fourth insulating film 625 are formed in order to block oxygen and $H_2O$. The third insulating film 620 and the fourth insulating film 625 also have functions such that the alkali metal element of the organic light emitting element 656 do not escape.

In an organic light emitting device with the structure shown in FIG. 6, a step of continuously forming the third insulating film 620 and the anode 621 made of a transparent conductive film typified by ITO by a sputtering method can be adopted as one example of the effective manufacturing method. The sputtering method is suitable for the formation of a fine silicon nitride film or silicon oxynitride film without remarkable damage on the surface of the organic insulating film 619.

Figure 7:
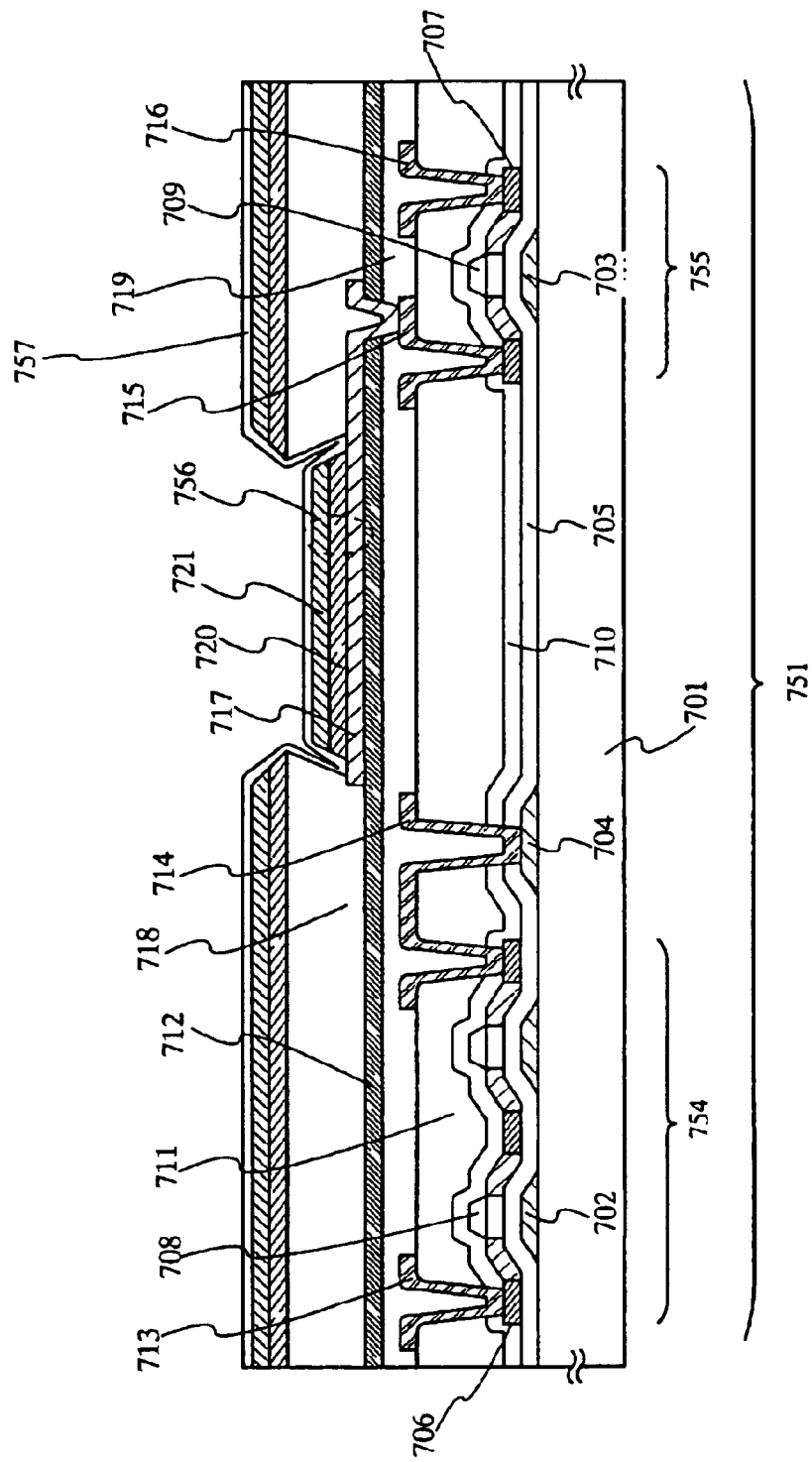
FIG. 7 is a cross sectional view explaining a structure of a pixel portion of the organic light emitting device.

As described above, the pixel portion is formed by combining the TFT and the organic light emitting device to complete the light emitting device. In such a light emitting device, the driver circuit using the TFT may be formed on the same substrate. As shown in FIG. 6 or 7, the semiconductor film, the gate insulating film and the gate electrode, which are the main structural components of the TFT, are surrounded by the blocking layer and the protective film which are made of silicon nitride or silicon oxynitride on the lower and upper layer sides. Thus, the TFT has the structure for preventing contamination due to the alkali metal or organic material. On the other hand, the organic light emitting element partially contains the alkali metal and is surrounded by the protective film formed of silicon nitride or silicon oxynitride and a gas-barrier layer formed of the insulating film containing silicon nitride or carbon as its main constituent. Thus, the organic light emitting element has the structure for preventing permeation of oxygen and $H_2O$ from the outside.

As described above, according to the present invention, the light emitting device can be completed by combining elements; with different characteristics to the impurities without the mutual interference of the elements. Further, the influence due to the stress is eliminated to improve the reliability.

Embodiment 4

A top gate type TFT structure is explained in Embodiment 3. However, a bottom gate or inverted stagger type TFT may also be applied, of course. In FIG. 7, a switching TFT 754 and a current control TFT 755 are formed in a pixel portion 751 by using the inverted stagger type TFTs. Gate electrodes 702 and 703 and a wiring 704 formed of molybdenum or tantalum are provided on a substrate 701, and a first insulating film 705 functioning as gate insulating film is formed thereon. The first insulating film 705 is formed using silicon oxide or silicon nitride with a thickness of 100 to 200 nm.

In addition to a channel forming region, a source or drain region and an LDD region are formed in semiconductor films 706 and 707. Insulating films 708 and 709 are provided in order to form the above regions and to protect the channel forming region. A second insulating film 710 is formed of silicon nitride or silicon oxynitride and is provided such that the semiconductor films are not contaminated by an alkali metal, organic material or the like. Further, a first interlayer insulating film 711 formed of an organic resin material such as polyimide is formed. Then, after contact holes are formed, wirings 713 to 716 are formed, and a second interlayer insulating film 719 is formed. The second interlayer insulating film 719 is also formed of the organic resin material such as polyimide. A third insulating film 712 comprised of silicon nitride or silicon oxide is formed thereon. The wirings 713 to 716 are formed on the third insulating film 712.

An anode 717 of an organic light emitting element 756 is formed on the third insulating film 712, and then, a partition layer 718 is formed of polyimide. The surface of the partition layer 718 may be subjected to a plasma pre-processing by argon to make the surface finer. However, as shown in FIG. 7, the insulating film 719 comprised of a silicon nitride film is formed, and a gas emission preventing process may be conducted. The structures of an organic compound layer 720, a cathode 721 and a fourth insulating film are the same as in Embodiment 2. Thus, the light emitting device can be completed by using the inverted stagger type TFTs.

Further, a driver circuit may be formed on the same substrate by using the inverted stagger type TFTs. As shown in FIG. 7, the semiconductor film as the main structural component of the TFT is surrounded by the first insulating film and the second insulating film which are formed of silicon nitride or silicon oxynitride on the lower and upper layer sides. Thus, the TFT has the structure for preventing contamination of the alkali metal or organic material. On the other hand, the organic light emitting element partially contains the alkali metal and has the structure for preventing invasion of oxygen and $H_2O$ from the outside by the third insulating film 712 and the fourth insulating film 757. As described above, there is provided a technique of forming the light emitting device by combining elements with different characteristics to the impurities without the mutual interference of the elements even in case of using the inverted stagger type TFTs.

Embodiment 5

Figure 10:
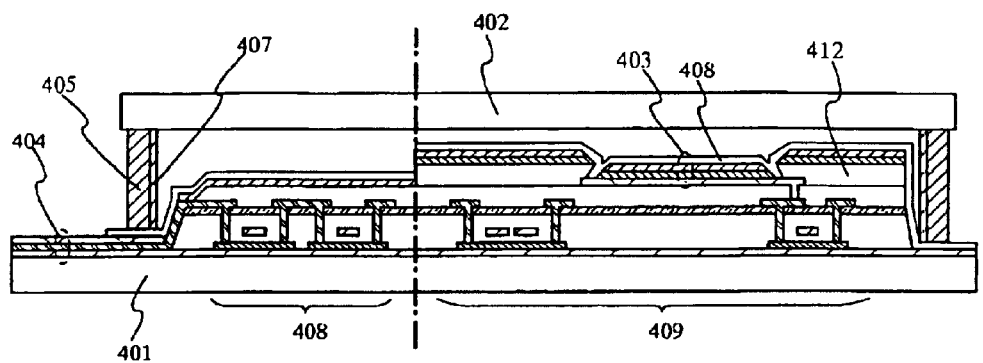
FIG. 10 is a cross sectional view explaining a structure of an organic light emitting device.

A structure for sealing the organic light emitting element formed in Embodiment 3 or 4 is shown in the figure. FIG. 10 shows the state that an element substrate 401 on which a driver circuit 408 and a pixel portion 409 are formed using TFTs and a sealing substrate 402 are fixed by a sealing member 405. An organic light emitting element 403 is formed in a sealed region between the element substrate 401 and the sealing substrate 402, and a drying agent 407 is provided on the driver circuit 408 or in the vicinity of the sealing member 405. The organic light emitting element 403 is formed being sandwiched by the partition layers 412.

An organic resin material such as polyimide, polyethylene terephthalate (PET), polyethylene naphthalate (PEN), polyether sulfone (PES) or aramide is used for the sealing substrate. It is possible that the substrate with a thickness of about 30 to 120 $\mu$m is adopted such that the substrate has flexibility. The DLC film (fourth insulating film) 408 as a gas-barrier layer is formed at the end portion of the sealing substrate. However, the DLC film is not formed in an external input terminal 404. An epoxy-based adhesive is used for the sealing member. The DLC film 408 is formed along the sealing member 405 and also along the end portions of the element substrate 401 and the sealing substrate 402, whereby it is possible to prevent $H_2O$ from permeating from the above portions.

Figure 11:
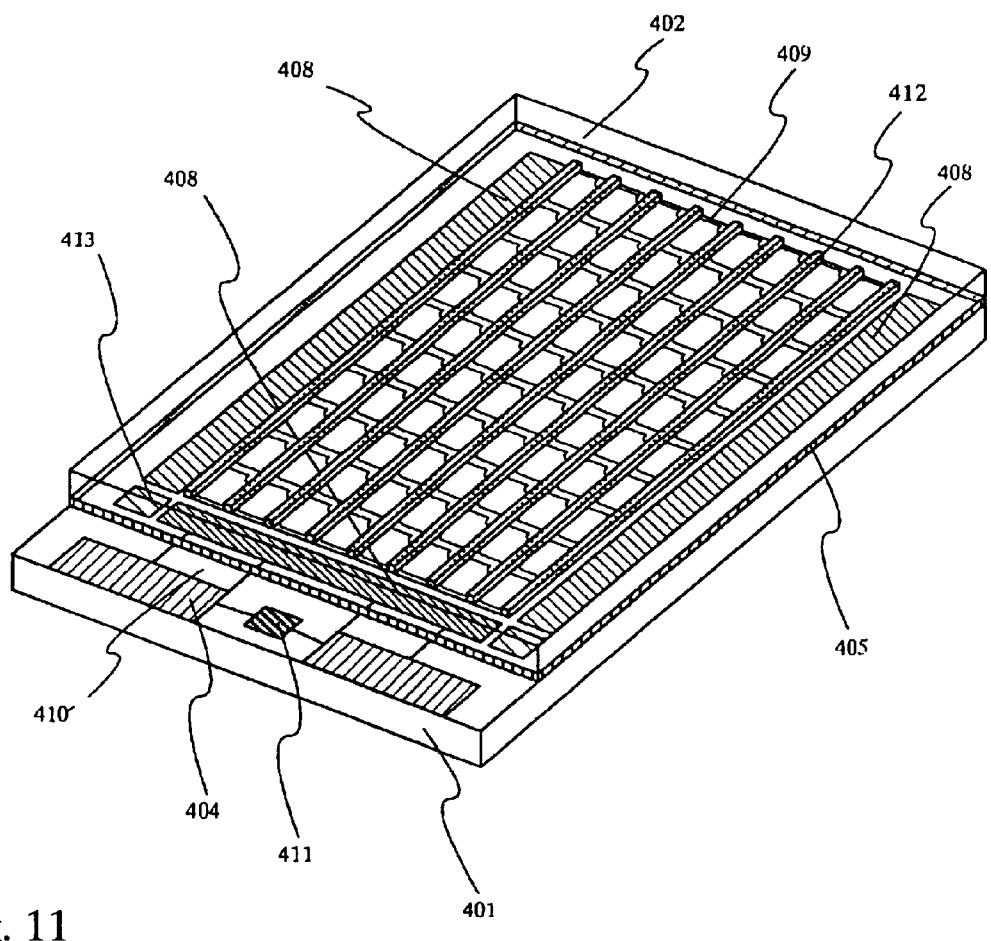
FIG. 11 is a perspective view explaining an outer appearance of the organic light emitting device.
Figure 12:
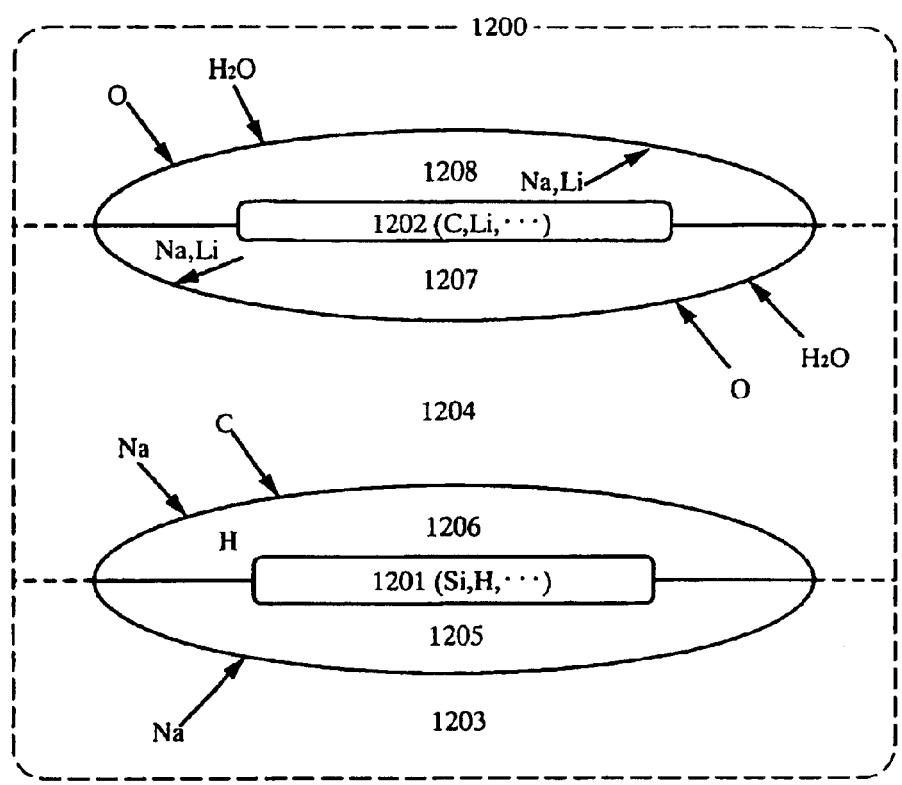
FIG. 12 is a diagram explaining a concept of a light emitting device according to the present invention.

FIG. 11 is a diagram showing an outer appearance of such a display device. The direction in which an image is displayed differs depending on the structure of the organic light emitting element. Here, the display is performed with the light emission toward the top. In the structure shown in FIG. 11, the element substrate 401 on which the driver circuit portion 408 and the pixel portion 409 are formed using the TFTs and the sealing substrate 402 are bonded by the sealing member 405. The partition layers 412 are formed in the pixel portion 409. The input terminal 404 is provided at the end portion of the element substrate 401 and is connected to a flexible printed circuit (FPC). The terminals for inputting an image data signal, various timing signals and a power source from an external circuit are provided at 500 $\mu$m intervals in the input terminal 404. The input terminal 404 is connected to the driver circuit portion through a wiring 410. Further, an IC chip 411 in which a CPU, a memory and the like are formed may be mounted to the element substrate 401 by a COG (chip on glass) method if necessary.

The DLC film is formed at the end portions of the substrates and prevents deterioration of the organic light emitting element due to permeation of water vapor, oxygen and the like from the sealed portion. In the case where the organic resin material is used for the element substrate 401 or the sealing substrate 402, the DLC film may be formed over the entire surface except the input terminal portion. When the DLC film is formed, the input terminal portion may be covered in advance by using a masking tape or a shadow mask.

As described above, the light emitting device can be formed by sealing the organic light emitting element formed in Embodiment 3 or 4. The structure of the light emitting device is such that the TFT and the organic light emitting element are both surrounded by the insulating films and the impurities do not permeate from the outside. Further, the element substrate and the sealing substrate are bonded to each other by using the sealing member, and the end portions are covered with the DLC film to thereby improve airtightness. Thus, the deterioration of the light emitting device can be prevented.

Embodiment 6

The present invention can be applied to a display medium used in various electronic devices. As such electronic devices, a portable information terminal (electronic notebook, mobile computer, portable telephone or the like), a video camera, a digital camera, a personal computer, a television set, a portable telephone, and the like can be given. Examples thereof are shown in FIGS. 13A to 13G.

Figure 13A:
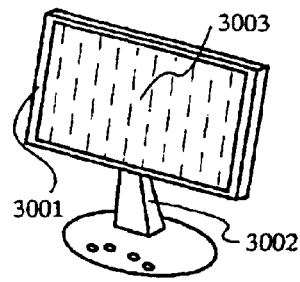
FIGS. 13A to 13G are diagrams explaining with examples of electronic devices to which the light emitting device of the present invention is applied.

FIG. 13A shows a television set completed by applying the light emitting device of the present invention, which is constituted of a casing 3001, a support base 3002, a display portion 3003 and the like. The light emitting device of the present invention is applied to the display portion 3003.

Figure 13B:
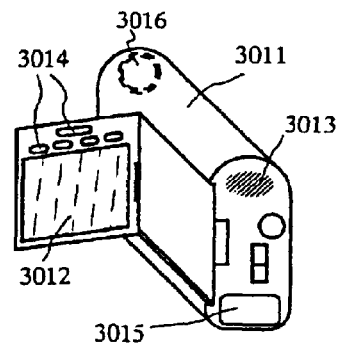

FIG. 13B shows a video camera completed by applying the tight emitting device of the present invention, which is constituted of a main body 3011, a display portion 3012, a sound input portion 3013, operation switches 3014, a battery 3015, an image receiving portion 3016 and the like. The light emitting device of the present invention is applied to the display portion 3012.

Figure 13C:
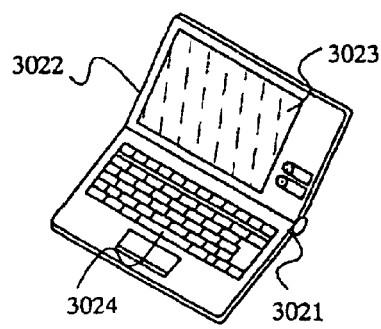

FIG. 13C shows a note-type personal computer completed by applying the light emitting device of the present invention, which is constituted of a main body 3021, a casing 3022, a display portion 3023, a keyboard 3024 and the like. The light emitting device of the present invention is applied to the display portion 3023.

Figure 13D:
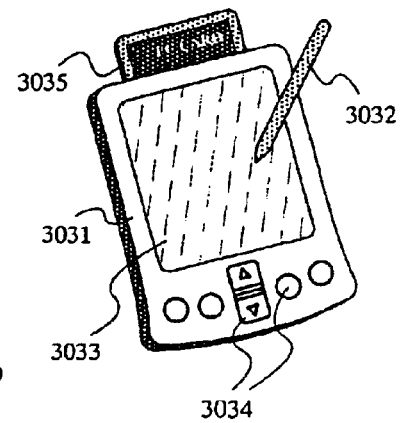

FIG. 13D shows a PDA (personal digital assistant) completed by applying the light emitting device of the present invention, which is constituted of a main body 3031, a stylus 3032, a display portion 3033, operation buttons 3034, an external interface 3035 and the like. The light emitting device of the present invention can be applied to the display portion 3033.

Figure 13E:
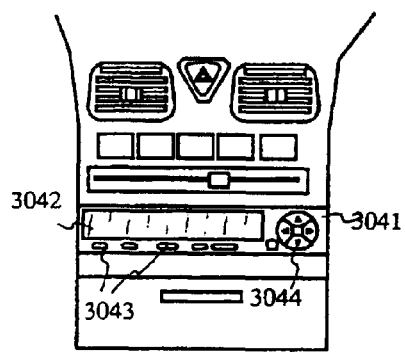

FIG. 13E shows a sound playback device completed by applying the light emitting device of the present invention, specifically, an audio device for automobile, which is constituted of a main body 3041, a display portion 3042, operation switches 3043, 3044 and the like. The light emitting device of the present invention can be applied to the display portion 3042.

Figure 13F:
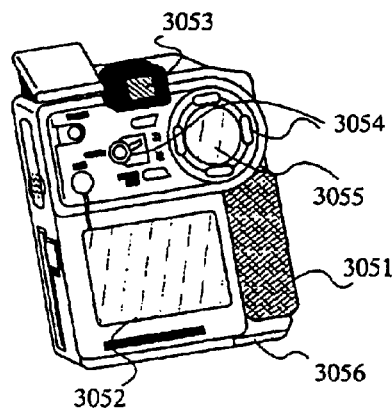

FIG. 13F shows a digital camera completed by applying the light emitting device of the present invention, which is constituted of a main body 3051, a display portion (A) 3052, an eyepiece portion 3053, operation switches 3054, a display portion (B) 3055, a battery 3056 and the like. The light emitting device of the present invention can be applied to the display portion (A) 3052 and the display portion (B) 3055.

Figure 13G:
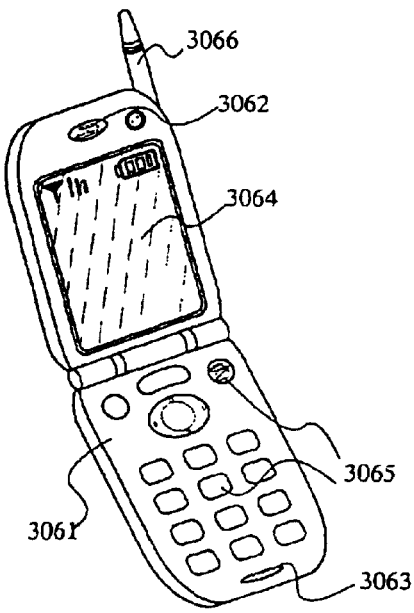

FIG. 13G shows a portable telephone completed by applying the light emitting device of the present invention, which is constituted of a main body 3061, a sound output portion 3062, a sound input portion 3063, a display portion 3064, operation switches 3065, an antenna 3066 and the like. The light emitting device of the present invention can be applied to the display portion 3064.

Note that the electronic devices shown here are some examples, and the present invention is not limited to these applications.

As described above, the deterioration due to the stress of the organic light emitting element can be prevented by applying the present invention. Further, in the present invention, the semiconductor film, the gate insulating film and the gate electrode, which are the main structural components of the TFT, are surrounded by the first insulating layer and the second insulating layer which are formed of silicon nitride or silicon oxynitride on the lower layer side and the upper layer side. Thus, the TFT has the structure for preventing contamination due to the alkali metal or organic material. On the other hand, the organic light emitting element partially contains the alkali metal and is surrounded by the third insulating layer formed of silicon nitride or silicon oxynitride and the fourth insulating layer formed of the insulating film containing carbon as its main constituent. Thus, the structure for preventing permeation of oxygen and $H_2O$ from the outside is realized in the organic light emitting element. Accordingly, the light emitting device can be completed by combining the elements with different characteristics to the impurities without the mutual interference of the elements.

What is claimed is:

1. A light emitting device comprising:

a first insulating layer comprising silicon nitride or silicon oxynitride;

a second insulating layer comprising silicon oxynitride over said first insulating layer;

a thin film transistor formed between said first insulating layer and said second insulating layer, said thin film transistor having a semiconductor layer comprising silicon, a gate insulating film, and a gate electrode;

a third insulating layer comprising silicon nitride or silicon oxynitride over said second insulating layer;

a fourth insulating layer comprising carbon over said third insulating layer;

a light emitting element formed between said third insulating layer and said fourth insulating layer, said light emitting element comprising an anode, an organic compound layer, and a cathode comprising an alkali metal; and partition layers comprising an insulating material on said third insulating layer, wherein said light emitting element is formed between partition layers, wherein at least an edge of said anode or at least an edge of said cathode is covered with at least one of said partition layers, and wherein said partition layers are directly in contact with said third insulating layer and either said anode or said cathode.

2. A light emitting device according to claim 1, wherein said fourth insulating layer comprises diamond-like carbon.

3. A light emitting device according to claim 1, wherein an organic resin layer is provided between said second insulating layer and said third insulating layer.

4. A light emitting device comprising:
- a first insulating layer comprising silicon nitride or silicon oxynitride;
- a second insulating layer comprising silicon oxynitride over said first insulating layer;
- a thin film transistor formed between said first insulating layer and said second insulating layer, said thin film transistor having a semiconductor layer comprising silicon, a gate insulating film, and a gate electrode;
- a third insulating layer comprising silicon nitride or silicon oxynitride over said second insulating layer;
- a fourth insulating layer comprising carbon over said third insulating layer;
- a light emitting element formed between said third insulating layer and said fourth insulating layer, said light emitting element comprising an anode, an organic compound layer, and a cathode comprising an alkali metal; and
- partition layers comprising an insulating material on said third insulating layer,
- wherein said light emitting element is formed between partition layers,
- wherein said partition layers have a shape in which an upper portion protrudes in a direction parallel to a substrate,
- wherein at least an edge of said anode or at least an edge of said cathode is covered with at least one of said partition layers, and
- wherein said partition layers are directly in contact with said third insulating layer and either said anode or said cathode.

5. A light emitting device according to claim 4, wherein said fourth insulating layer comprises diamond-like carbon.

6. A light emitting device according to claim 4, wherein an organic resin layer is provided between said second insulating layer and said third insulating layer.

7. A light emitting device comprising:
- a first insulating layer comprising silicon nitride or silicon oxynitride;
- a second insulating layer comprising silicon oxynitride over said first insulating layer;
- a thin film transistor formed between said first insulating layer and said second insulating layer, said thin film transistor having a semiconductor layer comprising silicon, a gate insulating film, and a gate electrode;
- a third insulating layer comprising silicon nitride or silicon oxynitride over said second insulating layer;
- a fourth insulating layer comprising carbon over said third insulating layer;
- a light emitting element formed between said third insulating layer and said fourth insulating layer, said light emitting element comprising an anode, an organic compound layer, and a cathode comprising an alkali metal; and
- partition layers comprising an insulating material on said third insulating layer,
- wherein said light emitting element is formed between partition layers,
- wherein said organic compound layer and said cathode are provided without contacting said partition layers,
- wherein at least an edge of said anode or at least an edge of said cathode is covered with at least one of said partition layers, and
- wherein said partition layers are directly in contact with said third insulating layer and either said anode or said cathode.

8. A light emitting device according to claim 7, wherein said fourth insulating layer comprises diamond-like carbon.

9. A light emitting device according to claim 7, wherein an organic resin layer is provided between said second insulating layer and said third insulating layer.

10. A light emitting device comprising:
- a first insulating layer comprising silicon nitride or silicon oxynitride;
- a second insulating layer comprising silicon oxynitride over said first insulating layer;
- a thin film transistor formed between said first insulating layer and said second insulating layer, said thin film transistor having a semiconductor layer comprising silicon, a gate insulating film, and a gate electrode;
- a third insulating layer comprising silicon nitride or silicon oxynitride over second insulating layer; and
- a fourth insulating layer comprising carbon over third insulating layer;
- a light emitting element formed between said third insulating layer and said fourth insulating layer, said light emitting element comprising an anode, an organic compound layer, and a cathode comprising an alkali metal; and
- partition layers comprising an insulating material on said third insulating layer,
- wherein said light emitting element is formed between partition layers having a shape in which an upper portion protrudes in a direction parallel to a substrate,
- wherein said organic compound layer and said cathode are provided without contacting said partition layers,
- wherein at least an edge of said anode or at least an edge of said cathode is covered with at least one of said partition layers, and
- wherein said partition layers are directly in contact with said third insulating layer and either said anode or said cathode.

11. A light emitting device according to claim 10, wherein said fourth insulating comprises diamond-like carbon.

12. A light emitting device according to claim 10, wherein an organic resin layer is provided between said second insulating layer and said third insulating layer.

13. A light emitting device comprising:
- a substrate;
- a gate electrode over said substrate;
- a first insulating layer comprising silicon nitride or silicon oxynitride over said gate electrode;
- a semiconductor film over said first insulating film;
- a second insulating layer comprising silicon oxynitride over said semiconductor film;
- a third insulating layer comprising silicon nitride or silicon oxynitride over said second insulating film; and
- a light emitting element over said third insulating layer, said light emitting element having an anode, an organic compound layer, and a cathode comprising an alkali metal;
- a fourth insulating layer comprising carbon over said light emitting element; and partition layers comprising an insulating material over said third insulating layer, wherein said light emitting element is formed between partition layers, wherein at least an edge of said anode or at least an edge of said cathode is covered with at least one of said partition layers, and wherein said partition layers are directly in contact with said third insulating layer and either said anode or said cathode.

14. A light emitting device according to claim 13, wherein said fourth insulating comprises diamond-like carbon.

15. A light emitting device according to claim 13, wherein an organic resin layer is provided between said second insulating layer and said third insulating layer.

16. A light emitting device comprising:

a substrate;

a first insulating layer comprising a material selected from the group consisting of silicon nitride and silicon oxynitride over said substrate;

a plurality of thin film transistors formed on said first insulating layer;

a second insulating layer comprising silicon oxynitride over said plurality of thin film transistors;

a third insulating layer comprising a material selected from the group consisting of silicon nitride and silicon oxynitride over said second insulating layer;

a plurality of light emitting elements arranged in a matrix over said substrate wherein said plurality of thin film transistors are operationally connected to said plurality of light emitting elements, each of the light emitting elements comprising an anode, a cathode comprising an alkali metal and an organic compound layer between said anode and said cathode;

a plurality of partition layers formed over said third insulating layer and extending in parallel; and a fourth insulating layer comprising carbon formed over said plurality of light emitting elements wherein each of said light emitting elements is interposed between said third and fourth insulating layers, wherein said light emitting elements arranged in a same row or a same column of said matrix are disposed between and along adjacent ones of said plurality of partition layers, wherein at least an edge of said anode or at least an edge of said cathode is covered with at least one of said plurality of partition layers, and wherein said partition layers are directly in contact with said third insulating layer and either said anode or said cathode.

17. A light emitting device according to claim 16, wherein said fourth insulating layer comprises diamond-like carbon.

18. A light emitting device according to claim 16, wherein an organic resin layer is provided between said second insulating layer and said third insulating layer.

19. A light emitting device according to claim 16, wherein said plurality of partition layers are spaced apart from said cathode and said organic compound layer of said light emitting elements.

20. A light emitting device comprising:

a substrate;

a first insulating layer comprising a material selected from the group consisting of silicon nitride and silicon oxynitride over said substrate;

at least one thin film transistor formed on said first insulating layer;

a second insulating layer comprising silicon oxynitride over said thin film transistor;

a third insulating layer comprising a material selected from the group consisting of silicon nitride and silicon oxynitride over said second insulating layer;

at least one light emitting element wherein said thin film transistor is operationally connected to said light emitting element, said light emitting element comprising an anode, a cathode comprising an alkali metal and an organic compound layer between said anode and said cathode; and at least first and second partition layers over said third insulating layers wherein said light emitting element is disposed between said first and second partition layers, a fourth insulating layer comprising carbon formed over said light emitting element wherein the light emitting element is interposed between said third and fourth insulating layers, wherein a distance between opposed edges of said first and second partition layers at a top portion of said first and second partition layers is smaller than a distance between opposed edges of said first and second partition layers at a bottom portion of said first and second partition layers, wherein at least an edge of said anode or at least an edge of said cathode is covered with at least one of said first partition layer and said second partition layer, and wherein said partition layers are directly in contact with said third insulating layer and either said anode or said cathode.

21. A light emitting device according to claim 20, wherein said fourth insulating layer comprises diamond-like carbon.

22. A light emitting device according to claim 20, wherein an organic resin layer is provided between said second insulating layer and said third insulating layer.

23. A light emitting device according to claim 20, wherein said plurality of partition layers are spaced apart from said cathode and said organic compound layer of said light emitting elements.

* * * * *